United States Patent
Fujinaga et al.

(10) Patent No.: US 6,670,711 B2
(45) Date of Patent: Dec. 30, 2003

(54) SEMICONDUCTOR DEVICE INCLUDING LOW DIELECTRIC CONSTANT INSULATING FILM FORMED ON UPPER AND SIDE SURFACES OF THE GATE ELECTRODE

(75) Inventors: Masato Fujinaga, Tokyo (JP); Tatsuya Kunikiyo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/218,330

(22) Filed: Aug. 15, 2002

(65) Prior Publication Data

US 2003/0089922 A1 May 15, 2003

(30) Foreign Application Priority Data

Nov. 15, 2001 (JP) .................................. 2001-350150

(51) Int. Cl.[7] .............................................. H01L 23/48
(52) U.S. Cl. ..................... 257/758; 257/332; 257/346; 257/387
(58) Field of Search ................... 257/758, 332, 257/346, 387, 388, 412, 413

(56) References Cited

U.S. PATENT DOCUMENTS

| | | | | |
|---|---|---|---|---|
| 5,899,721 A | * | 5/1999 | Gardner et al. | 438/303 |
| 6,239,014 B1 | * | 5/2001 | Liaw | 438/616 |
| 6,245,625 B1 | * | 6/2001 | Gau | 438/305 |
| 6,255,703 B1 | * | 7/2001 | Hause et al. | 257/384 |
| 6,495,889 B1 | * | 12/2002 | Takahashi | 257/382 |
| 2002/0024093 A1 | * | 2/2002 | Ahn et al. | 257/332 |

FOREIGN PATENT DOCUMENTS

| | | |
|---|---|---|
| JP | 8-32056 | 2/1996 |
| JP | 9-321238 | 12/1997 |
| JP | 10-27794 | 1/1998 |
| JP | 11-87652 | 3/1999 |
| JP | 11-214678 | 8/1999 |
| JP | 2000-340792 | 12/2000 |

* cited by examiner

*Primary Examiner*—David Nelms
*Assistant Examiner*—Andy Huynh
(74) *Attorney, Agent, or Firm*—Oblon, Spivak, McClelland, Maier & Neustadt, P.C.

(57) ABSTRACT

A semiconductor device having a self-aligned contact structure. To determine the position of a contact plug in a self-aligned manner, silicon nitride films are provided around a gate electrode and a bitline, respectively. Between the gate electrode and bitline, and the silicon nitride films are provided low dielectric constant insulation films having a dielectric constant lower than that of the silicon nitride films. Further, the low dielectric constant insulation films are provided in contact with the gate electrode and bitline. The presence of the low dielectric constant insulation films suppresses the increase in parasitic capacitance resulting from the presence of the silicon nitride films between the gate electrode and bitline, and the contact plug.

2 Claims, 7 Drawing Sheets

1

SEMICONDUCTOR DEVICE INCLUDING LOW DIELECTRIC CONSTANT INSULATING FILM FORMED ON UPPER AND SIDE SURFACES OF THE GATE ELECTRODE

BACKGROUND OF THE INVENTION

1. Field of the Invention

The present invention relates to a semiconductor device and a method of manufacturing the same. More particularly, the invention relates to a semiconductor device having a self-aligned contact (SAC) structure.

2. Description of the Background Art

With recently increasing integration level and operating speed of semiconductor devices, there has been a demand for size reduction of an interconnection structure for connection between semiconductor devices. Reductions in distance between interconnect lines and in distance between contacts for connection between an interconnect line and an underlying semiconductor device have become accordingly important. Formation of such fine contacts requires high position accuracy in the patterning of contact holes. This position accuracy is determined by the accuracy of pattern alignment (or registration) in an exposure apparatus. Therefore, improving the accuracy of pattern alignment is a significant challenge.

There is a self-aligned contact (SAC) technique which is a process technique of contact hole formation for increasing the integration level of semiconductor devices while taking into account the insufficient accuracy of pattern alignment of the state-of-the-art exposure apparatus.

FIGS. 17A through 17H are sectional views showing the steps of manufacturing a background art semiconductor device disclosed in Japanese Patent Application Laid-Open No. 11-87652 (1999). Specifically, the steps of forming contacts using the self-aligned contact technique in a DRAM memory cell are shown in FIGS. 17A through 17H.

First, isolators 102 are formed in a P-type semiconductor substrate 101. Then, a gate oxide film 103, an N-type polycrystalline silicon film and a silicon nitride film are deposited and patterned, whereby a gate electrode 106 of a MOS transistor and an on-gate nitride film 107 are formed. Next, using the on-gate nitride film 107 and the gate electrode 106 as a mask, phosphorus ions are implanted to form a first impurity diffused region 104 and a second impurity diffused region 105 which serve as source/drain regions (FIG. 17A).

A silicon nitride film is deposited over the substrate, and is then anisotropically etched to form gate sidewall nitride films 109 (FIG. 17B).

Next, a first interlayer insulation film 110 is deposited, and the upper surface of the first interlayer insulation film 110 is flattened by a CMP planarization process. Then, contact windows extending respectively to the first and second impurity diffused regions 104 and 105 are formed in the first interlayer insulation film 110. An N-type polycrystalline silicon film is deposited over the substrate, and part of the N-type polycrystalline silicon film which overlies the first interlayer insulation film 110 is removed by a CMP process. This forms first and second plugs 111 and 112 (FIG. 17C).

Then, an under-interconnect insulation film 113 made of silicon oxide is deposited on the first interlayer insulation film 110 and the first and second plugs 111, 112. Thereafter, a photoresist film is formed on the silicon oxide film 113, the photoresist film having an opening over the first plug 111 for connection to the first impurity diffused region 104. Using the photoresist film as a mask, etching is performed to form a contact window 114 extending to the first plug 111 (FIG. 17D).

A tungsten film and a silicon nitride film are deposited in the order named on the substrate, and are then patterned. This forms a bitline 115 for connection to the first plug 111 and an on-bitline nitride film 116 (FIG. 17E).

A silicon nitride film is deposited on the substrate, and is then anisotropically etched. This forms bitline sidewall nitride films 117 on the side surfaces of the bitline 115 and the on-bitline nitride film 116 (FIG. 17F).

A second interlayer insulation film 118 made of silicon oxide is deposited, and the upper surface of the second interlayer insulation film 118 is flattened by a CMP planarization process. Then, a contact window extending to the second plug 112 is formed in the second interlayer insulation film 118 and the silicon oxide film 113. An N-type polycrystalline silicon film is deposited over the substrate, and part of the N-type polycrystalline silicon film which overlies the second interlayer insulation film 118 is removed by a CMP process. This forms a third plug 119 for connection to the second plug 112 (FIG. 17G).

A ruthenium film is deposited using a sputtering process and is then patterned to form a storage electrode 120. Next, a BST film and a ruthenium film are deposited in the order named using a CVD process and are then patterned. This forms a capacitor film 121 and a plate electrode 122 (FIG. 17H).

If the gate sidewall nitride films 109 and the on-gate nitride film 107 are exposed in the contact windows when forming the contact windows in the step shown in FIG. 17C, the above-mentioned method of manufacturing a DRAM memory cell can maintain a sufficiently high etch selectivity between the silicon oxide film and the silicon nitride film to reliably prevent the gate electrode 106 from being exposed by the removal of the on-gate nitride film 107 and the gate sidewall nitride films 109. In other words, the method can prevent a short circuit between the first and second plugs 111, 112 and the gate electrode 106.

Similarly, if the bitline sidewall nitride films 117 and the on-bitline nitride film 116 are exposed in the contact window when forming the contact window in the step shown in FIG. 17G, the method can reliably prevent the bitline 115 from being exposed by the removal of the on-bitline nitride film 116 and the bitline sidewall nitride films 117. In other words, the method can also prevent a short circuit between the third plug 119 and the bitline 115.

As described in the above example, in the method of manufacturing a semiconductor device using the self-aligned contact technique, the silicon nitride films are used as the overlying films and sidewalls of the gate electrode 106 and the bitline 115. This prevents the sidewalls and the like from being etched, if the opening area of the contact windows when formed overlaps the gate electrode 106 and the bitline 115 or their sidewalls and the like, because of the etch selectivity between the oxide film and the nitride film. Thus, the contact windows are defined in a self-aligned manner by the widths of the sidewalls 109 of the lower gate electrode 106 and the sidewalls 117 of the bitline 115. There is no need to take into consideration a misalignment between patterns in the exposure step which accompanies the patterning of contact holes. In other words, the method using the self-aligned contact technique can reduce a margin for the pattern alignment even if the exposure apparatus has insufficient accuracy of pattern alignment, to contribute to the increase in integration level of the semiconductor device.

As described above, the self-aligned contact technique uses the etch selectivity between the oxide film constituting the interlayer insulation films and the nitride film. For this reason, the background art semiconductor device having the self-aligned contact structure has the nitride films provided around the gate electrode and the interconnect line. However, since the nitride film has a high dielectric constant and the relative dielectric constant of the nitride film is about 7 (whereas the relative dielectric constant of the oxide film is about 3.9), the semiconductor device having the self-aligned contact structure has an increased parasitic capacitance between gate electrodes and interconnect lines. This increase in capacitance is a serious hindrance to the reduction in power consumption and the increase in operating speed of the semiconductor device. Furthermore, since a decreasing spacing between the interconnect lines results in an abrupt increase in the capacitance between the interconnect lines, the above-mentioned problems have been more serious as the interconnection structure of semiconductor devices has become finer in recent years.

For example, the increase in the capacitance of a bitline of a DRAM decreases a signal voltage detected by a sense amplifier to make a malfunction prone to occur. Additionally, the increase in the capacitance increases the delay time of signal transmission of bitlines to create a need to reduce the lengths of the respective bitlines. Further, the need for an area of a sense amplifier for each of the bitlines increases a chip area to reduce the number of chips manufactured from one wafer, resulting in increased costs. Moreover, the gate electrode of the DRAM presents a problem such that the increasing capacitance leads to the increasing delay time of an inverter, and the like.

SUMMARY OF THE INVENTION

It is an object of the present invention to provide a semiconductor device having a self-aligned contact structure which can suppress a parasitic capacitance between conductors including electrodes and interconnect lines, and a method of manufacturing the same.

According to the present invention, the semiconductor device having a self-aligned contact structure includes a conductor, a contact plug, a silicon nitride film, and a low dielectric constant insulation film. The conductor includes an electrode and an interconnect line. The silicon nitride film serves as an insulation film between the conductor and the contact plug. The low dielectric constant insulation film has a dielectric constant lower than that of the silicon nitride film. The low dielectric constant insulation film is formed at least between the conductor and the silicon nitride film, and is provided in contact with the conductor.

The semiconductor device can suppress the increase in parasitic capacitance resulting from the presence of the silicon nitride film for SAC between the conductor and the contact plug.

These and other objects, features, aspects and advantages of the present invention will become more apparent from the following detailed description of the present invention when taken in conjunction with the accompanying drawings.

DESCRIPTION OF THE PREFERRED EMBODIMENT

<Preferred Embodiment>

Figure 1:
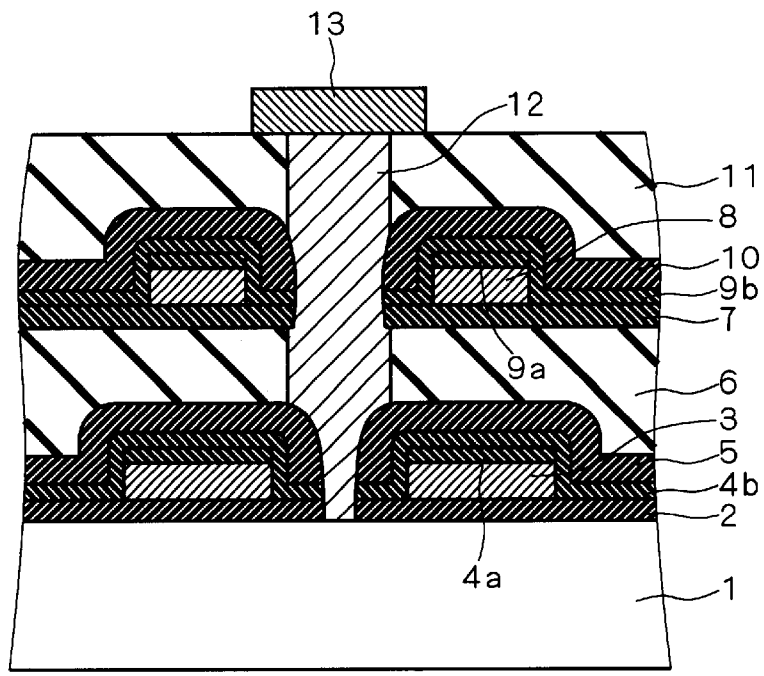
FIG. 1 is a sectional view showing a construction of a semiconductor device according to a preferred embodiment of the present invention.

FIG. 1 is a sectional view showing a construction of a semiconductor device according to a preferred embodiment of the present invention. An example of a DRAM having a COB (Capacitor Over Bitline) structure is shown in FIG. 1. In FIG. 1, the reference numeral 1 designates a silicon substrate; 2 designates a gate insulation film; 3 designates a gate electrode; the reference characters 4a, 4b, 7, 9a, 9b designate low dielectric constant insulation films (low-k films); 5, 10 designate silicon nitride films; 6 designates a TEOS oxide film; 8 designates a bitline; 11 designates a BPSG (Boro-phospho Silicate Glass) film; 12 designates a contact plug; and 13 designates a storage node electrode.

Specific examples of the materials of the respective components are as follows: the gate insulation film 2 made of silicon oxide; the gate electrode 3 made of WSi or polysilicon; the bitline 8 made of W; the contact plug 12 and the storage node electrode 13 made of polysilicon. An example of the material of the low-k films 4a, 4b, 7, 9a, 9b includes SiOF, SiOC, organic SOG (Spin On Glass), HSQ (hydrogen silsesquioxane), CVD organic silicon oxide, porous silica, organic polymers, polyimides, aromatic ethers, aromatic hydrocarbons, cyclobutane derivatives, fluoropolymers, or amorphous fluorocarbons. These materials of the low-k films have a relative dielectric constant of about 2.0 to about 3.0, and are known to be lower in dielectric constant than silicon oxide (having a relative dielectric constant of about 3.9).

It is found from FIG. 1 that the silicon nitride films 5 and 10 for self-aligned contact (SAC) are provided around the gate electrode 3 and the bitline 8 (which are collectively referred to also as a conductor). The semiconductor device according to the preferred embodiment features the low-k films 4a, 4b, 7, 9a, 9b provided in contact with the gate electrode 3 and the bitline 8 and between the gate electrode 3 and bitline 8, and the silicon nitride films 5, 10. The presence of the low-k films suppresses the increase in parasitic capacitance resulting from the presence of the silicon nitride films for SAC between the gate electrode 3 and the contact plug 12 and between the bitline 8 and the contact plug 12.

In this preferred embodiment, a SAC structure is employed around a wordline (gate) and a bitline with design rules of 0.2 $\mu$m or below. For example, assuming that the bitline 8 has a width of 0.1 $\mu$m and a height of 0.1 $\mu$m, the low-k films 9a, 9b, 7 having a thickness of 0.01 $\mu$m reduce the parasitic capacitance of the bitline 8 by about 3%. Similarly, the low-k films 9a, 9b, 7 having a thickness of 0.02 $\mu$m reduce the capacitance of the bitline 8 by about 6%.

It is evident that the greater the thickness of the low-k film, the higher the rate of reduction in the capacitance. Thinning the low-k film to about 0.01 $\mu$m is advantageous in that the present invention is easily applicable to the background art semiconductor device manufacturing steps without changes in scale of the design rules.

Of course, the lower the relative dielectric constant of the low-k film, the higher the rate of reduction in the capacitance. For example, the use of the above-mentioned materials having the relative dielectric constant of 2.0 to 3.0 can, in theory, provide a reduced capacitance approximately equal to that obtained from a structure in which the silicon nitride films are not provided around the electrode and the interconnect line (i.e., SAC is not used). It is evident that a material (e.g., silicon oxide) only having a dielectric constant lower than that of the silicon nitride films 5 and 10 can produce the effect of somewhat reducing the capacitance.

As discussed above, the low-k films 4a, 4b, 7, 9a, 9b are provided in contact with the gate electrode 3 or the bitline 8. It is obvious that only the provision of the low-k films around the electrode and the interconnect line whose capacitance is desired to decrease produces the effect. However, providing the low-k films in contact with the electrode and the interconnect line produces the effect more efficiently. The effect produced by providing the low-k films in contact with the electrode and the interconnect line will be described below.

Figure 2:
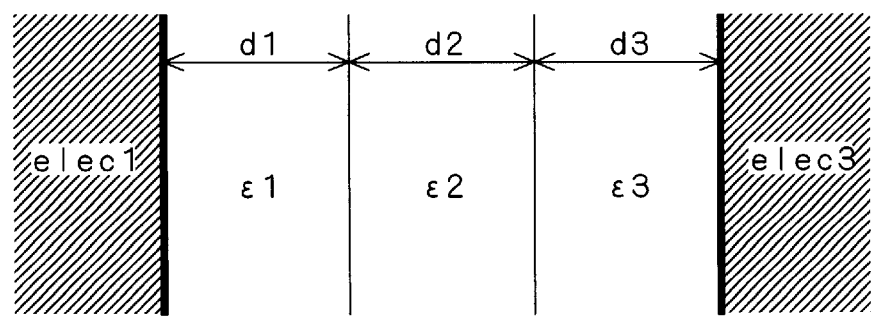
FIGS. 2 and 3 are views for illustrating the effects of the semiconductor device according to the preferred embodiment.

A parallel plate capacitor will be contemplated which has three dielectric layers of different dielectric constants between a pair of parallel plate electrodes elec1 and elec3 as shown in FIG. 2. It is assumed that the three (first, second and third) dielectric layers as seen from the electrode elec1 side of FIG. 2 have dielectric constants $\epsilon 1$, $\epsilon 2$ and $\epsilon 3$ and thicknesses d1, d2 and d3, respectively.

The quantity of electric charge Q of the electrode elec1 is $$Q = \int (r) dV \tag{1}$$

where $\rho(r)$ is a charge density. Using Poisson's equation:

$$\nabla(\epsilon \nabla \phi) = -\rho \tag{2}$$

where $\epsilon(r)$ is a dielectric constant, and $\phi(r)$ is an electrostatic potential, the quantity of electric charge Q is expressed as $$Q = \int \rho(r) dV = \int \epsilon(r) \nabla \phi(r) dS = \int \epsilon(r) E(r) dS \tag{3}$$

where E(r) is an electric field. Since there is no charge between the electrodes, an electric flux density $D(r) = \epsilon(r)E(r)$ is constant in the capacitor. The electric flux density D(r) can be expressed as $D(r) = \epsilon 1 \cdot E1 = \epsilon 2 \cdot E2 = \epsilon 3 \cdot E3 = D0 (= \text{constant})$ where E1, E2 and E3 are the electric fields in the first, second and third dielectric layers having the dielectric constants $\epsilon 1$, $\epsilon 2$ and $\epsilon 3$, respectively. Therefore, $E1 = D0/\epsilon 1$, $E2 = D0/\epsilon 2$ and $E3 = D0/\epsilon 3$.

The quantity of electric charge Q obtained when a voltage V is applied between the electrodes elec1 and elec3 is $$Q = \int \epsilon(r) E0(r) \cdot V \cdot dS \tag{4}$$

where E0(r) is an electric field produced when a unit voltage is applied between the electrodes elec1 and elec3. Therefore, the capacitance C of the capacitor is $$C = \frac{dQ}{dV} = \int \epsilon(r) E0(r) dS = \int D0 dS \text{ Since} \tag{5}$$

$$\int E0(r) dr = D0 \left( \frac{d1}{\epsilon 1} + \frac{d2}{\epsilon 2} + \frac{d3}{\epsilon 3} \right) = 1 \tag{6}$$

based on the definition of the electric field E0(r), D0 is expressed as $$D0 = \frac{1}{\frac{d1}{\epsilon 1} + \frac{d2}{\epsilon 2} + \frac{d3}{\epsilon 3}} \tag{7}$$

Therefore, the capacitance C is calculated as $$C = \int D0 dS = \frac{S}{\frac{d1}{\epsilon 1} + \frac{d2}{\epsilon 2} + \frac{d3}{\epsilon 3}} \tag{8}$$

where S is the area of the parallel plates. It will be found from Expression (8) that the capacitance of the parallel plate capacitor is determined independently of the order of the dielectric layers between the electrodes. For example, changing positions between the first and third dielectric layers of FIG. 2 brings about no changes in the capacitance of the capacitor.

Figure 3:
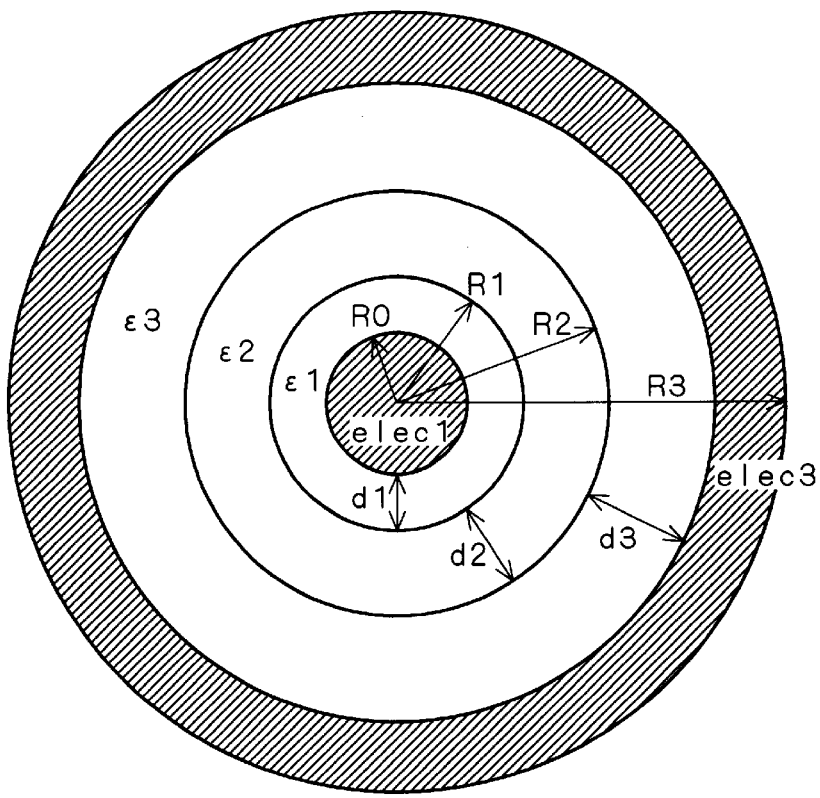

Next, another capacitor will be contemplated which has three dielectric layers of different dielectric constants between the pair of electrodes elec1 and elec3 of cylindrical configuration as shown in FIG. 3. It is assumed that the three (first, second and third) dielectric layers as seen from the electrode elec1 side (or the inside) of FIG. 3 have the dielectric constants $\epsilon 1$, $\epsilon 2$ and $\epsilon 3$ and thicknesses d1, d2 and d3, respectively. As shown in FIG. 3, R0+d1=R1, R1+d2=R2, and R2+d3=R3 where R0 is the radius of the electrode elec1.

The quantity of electric charge Q of the electrode elec1 is $$Q = \int \epsilon(r) E(r) dS \tag{9}$$

where $\epsilon(r)$ is a dielectric constant, and E(r) is an electric field. Using the length L of the cylinder of the electrodes and the radius r of the cylinder from the center thereof, the quantity of electric charge Q is expressed as $$Q = \epsilon(r) E(r) \cdot 2\pi r L \tag{10}$$

This is transformed into $E(r) = Q/(\epsilon(r) \cdot 2\pi r L)$.

Hence, the voltage V between the electrodes elec1 and elec3 is $$V = \int E(r) = \int \frac{Q}{\epsilon(r) \cdot 2\pi r L} dr = \frac{Q}{2\pi L} \int \frac{1}{\epsilon(r) \cdot r} dr \tag{11}$$

$$= \frac{Q}{2\pi L} \left[ \frac{\ln(R1/R0)}{\epsilon 1} + \frac{\ln(R2/R1)}{\epsilon 2} + \frac{\ln(R3/R2)}{\epsilon 3} \right]$$

Therefore, the capacitance C of the capacitor is calculated by $$C = \frac{Q}{dV} = 2\pi L \bigg/ \left[ \frac{\ln(R1/R0)}{\epsilon 1} + \frac{\ln(R2/R1)}{\epsilon 2} + \frac{\ln(R3/R2)}{\epsilon 3} \right] \tag{12}$$

Assuming that d1=d2=d3 and $\epsilon 1 > \epsilon 2 > \epsilon 3$, a change in capacitance C resulting from changing positions between the dielectric constants $\epsilon 1$ and $\epsilon 3$. The capacitance when the order of the dielectric constants of the respective dielectric layers as seen from the electrode elec1 side is $\epsilon 1$, $\epsilon 2$ and $\epsilon 3$ as shown in FIG. 3 is denoted by $C(\epsilon 1, \epsilon 2, \epsilon 3)$, and the capacitance when the positions are changed between the dielectric constants $\epsilon 1$ and $\epsilon 3$ in FIG. 3 or when the order of the dielectric constants of the respective dielectric layers as seen from the electrode elec1 side is $\epsilon 3$, $\epsilon 2$ and $\epsilon 1$ is denoted by $C(\epsilon 3, \epsilon 2, \epsilon 1)$. Then, $$C(\varepsilon 1, \varepsilon 2, \varepsilon 3) - C(\varepsilon 3, \varepsilon 2, \varepsilon 1) = \tag{13}$$

$$\frac{2\pi L(1/\varepsilon 3 - 1/\varepsilon 1)(\ln(R1/R0) - \ln(R3/R2))}{\left(\frac{\ln(R1/R0)}{\varepsilon 1} + \frac{\ln(R2/R1)}{\varepsilon 2} + \frac{\ln(R3/R2)}{\varepsilon 3}\right)}$$
$$\left(\frac{\ln(R1/R0)}{\varepsilon 3} + \frac{\ln(R2/R1)}{\varepsilon 2} + \frac{\ln(R3/R2)}{\varepsilon 1}\right)$$

Since $\varepsilon 1 > \varepsilon 2 > \varepsilon 3$ in Expression (13), $$1/\varepsilon 3 - 1/\varepsilon 1 > 0 \tag{14}$$

Since R0<R1<R2<R3, $$\ln(R1/R0) - \ln(R3/R2) = \ln\left(\frac{R1 \cdot R2}{R0 \cdot R3}\right) = \ln\left(\frac{(R0+d1) \cdot R2}{R0 \cdot (R2+d1)}\right) > 0 \tag{15}$$

Furthermore, $$\left(\frac{\ln(R1/R0)}{\varepsilon 1} + \frac{\ln(R2/R1)}{\varepsilon 2} + \frac{\ln(R3/R2)}{\varepsilon 3}\right) \tag{16}$$
$$\left(\frac{\ln(R1/R0)}{\varepsilon 3} + \frac{\ln(R2/R1)}{\varepsilon 2} + \frac{\ln(R3/R2)}{\varepsilon 1}\right) > 0$$

Therefore, $C(\varepsilon 1, \varepsilon 2, \varepsilon 3) - C(\varepsilon 3, \varepsilon 2, \varepsilon 1) > 0$ holds. Thus, the capacitance of the cylindrical capacitor as shown in FIG. 3 becomes lower as a dielectric layer having a low dielectric constant is positioned closer to the center thereof. That is, placing the dielectric layer having a low dielectric constant in a position closer to the center where the electric flux density is higher alleviates the electric flux density to reduce the capacitance. In other words, efficient reduction in the capacitance is achieved by providing the dielectric layer having a low dielectric constant in contact with the electrode elec1. This demonstrates that the provision of the low-k films having a low dielectric constant in contact with the gate electrode 3 and the bitline 8 as shown in FIG. 1 efficiently produces the effect of reducing the capacitance of the gate electrode 3 and the bitline 8.

Specific examples will be illustrated. It is assumed that the silicon oxide film has a relative dielectric constant of 3.9, the silicon nitride film has a relative dielectric constant of 7.0, and the low-k film has a relative dielectric constant of 3.0. The relative dielectric constant of a vacuum is denoted by $\varepsilon 0$, and the length of the cylindrical capacitor is denoted by L. The radius of the electrode elec1 is assumed to be R0=0.1 $\mu$m.

The capacitance C of the cylindrical capacitor will be determined when the first, second and third dielectric layers are the low-k film, the silicon oxide film and the silicon nitride film, respectively, each having a thickness of 0.1 $\mu$m. Based on the conditions, $\varepsilon 1=3.0\times\varepsilon 0$, $\varepsilon 2=3.9\times\varepsilon 0$, $\varepsilon 3=7.0\times\varepsilon 0$, R0=0.1, R1=0.2, R2=0.3, and R3=0.4. From Expression (12), the capacitance C is determined as $C=2.66\times 2\pi L\varepsilon 0$.

On the other hand, the capacitance C of the capacitor of the same shape when the first, second and third dielectric layers are the silicon oxide film, the low-k film and the silicon nitride film, respectively, is determined as $C=2.83\times 2\pi L\varepsilon 0$ because $\varepsilon 1=3.9\times\varepsilon 0$, $\varepsilon 2=3.0\times E0$, $\varepsilon 3=7.0\times\varepsilon 0$, R0=0.1, R1=0.2, R2=0.3, and R3=0.4. The capacitance in this case is greater by about 6% than the capacitance of the capacitor in which the first, second and third dielectric layers are the low-k film, the silicon oxide film and the silicon nitride film, respectively. This result shows that the efficient reduction in the capacitance is achieved by providing the dielectric layer having a low dielectric constant in contact with the electrode elec1. This verifies that the provision of the low-k film having a low dielectric constant in contact with the gate electrode 3 and the bitline 8 as shown in FIG. 1 efficiently produces the effect of reducing the capacitance of the gate electrode 3 and the bitline 8.

Next, a comparison will be made between the capacitance obtained when the low-k film having a thickness of 0.01 $\mu$m is present as the first dielectric layer in contact with the electrode elec1 and the capacitance obtained when the low-k film is absent. The thickness of each of the second and third dielectric layers is set at 0.1 $\mu$m since the silicon nitride film for SAC is required to be about 0.1 $\mu$m in thickness in consideration for the etch selectivity thereof to the oxide film and the like.

First, the capacitance C of the cylindrical capacitor will be determined when the first, second and third dielectric layers are the low-k film having a thickness of 0.01 $\mu$m, the silicon oxide film having a thickness of 0.1 $\mu$m, and the silicon nitride film having a thickness of 0.1 $\mu$m, respectively. Based on the conditions, $\varepsilon 1=3.0\times\varepsilon 0$, $\varepsilon 2=3.9\times\varepsilon 0$, $\varepsilon 3=7.0\times\varepsilon 0$, R0=0.10, R1=0.11, R2=0.21, and R3=0.31. Then, the capacitance C is determined as $C=3.95\times 2\pi L\varepsilon 0$.

On the other hand, the capacitance C when the low-k film is absent as the first dielectric layer (or the first dielectric layer is also the silicon oxide film) is determined as $C=4.07\times 2\pi L\varepsilon 0$ because $\varepsilon 1=\varepsilon 2=3.9\times\varepsilon 0$, $\varepsilon 3=7.0\times\varepsilon 0$, R0=0.10, R1=0.11, R2=0.21, and R3=0.31. The capacitance in this case is greater by about 3% than the capacitance of the capacitor in which the low-k film having the thickness of 0.01 $\mu$m is present as the first dielectric layer.

Another comparison will be made between the capacitance obtained when the low-k film having a thickness of 0.02 $\mu$m is present as the first dielectric layer in contact with the electrode elec1 and the capacitance obtained when the low-k film is absent. The thickness of each of the second and third dielectric layers is set at 0.1 $\mu$m.

First, the capacitance C of the cylindrical capacitor will be determined when the first, second and third dielectric layers are the low-k film having a thickness of 0.02 $\mu$m, the silicon oxide film having a thickness of 0.1 $\mu$m, and the silicon nitride film having a thickness of 0.1 $\mu$m, respectively. Based on the conditions, $\varepsilon 1=3.0\times\varepsilon 0$, $\varepsilon 2=3.9\times\varepsilon 0$, $\varepsilon 3=7.0\times\varepsilon 0$, R0=0.10, R1=0.12, R2=0.22, and R3=0.32. Then, the capacitance C is determined as $C=3.71\times 2\pi L\varepsilon 0$.

On the other hand, the capacitance C when the low-k film is absent as the first dielectric layer (or the first dielectric layer is also the silicon oxide film) is determined as $C=3.91\times 2\pi L\varepsilon 0$ because $\varepsilon 1=\varepsilon 2=3.9\times\varepsilon 0$, $\varepsilon 3=7.0\times\varepsilon 0$, R0=0.10, R1=0.12, R2=0.22, and R3=0.32. The capacitance in this case is greater by about 5% than the capacitance of the capacitor in which the low-k film having the thickness of 0.02 $\mu$m is present as the first dielectric layer.

The above examples show that even the low-k films as thin as 0.01 $\mu$m and 0.02 $\mu$m produce the sufficient effect. This demonstrates that even if the thickness of the low-k films around the gate electrode 3 and the bitline 8 as shown in FIG. 1 is so small that there is no need to change the scale of the design rules, the effect of reducing the capacitance of the gate electrode 3 and the bitline 8 is sufficiently produced.

FIGS. 4 through 10 are views showing a method of manufacturing the semiconductor device shown in FIG. 1 in a step-by-step manner according to the preferred embodiment of the present invention. Like reference characters are used to designate components identical with those of FIG. 1.

Figure 4:
FIGS. 4 through 10 are views showing a method of manufacturing the semiconductor device in a step-by-step manner according to the preferred embodiment.
Figure 5:
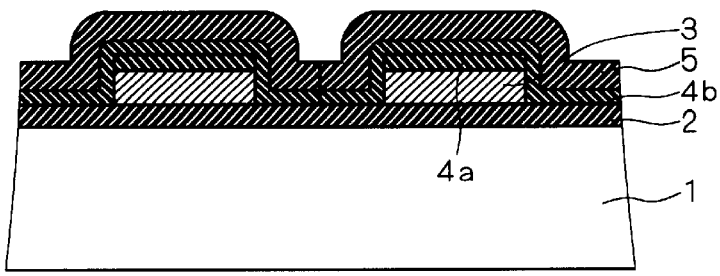

First, the gate insulation film 2 made of silicon oxide is formed on the silicon substrate 1 (FIG. 4). Next, for example, WSi or polysilicon is deposited on the gate insulation film 2, and a low-k film is formed on the WSi or polysilicon. Etching is performed to form the gate electrode 3 with the low-k film 4a formed on the upper surface thereof. The low-k film 4b and the silicon nitride film 5 are deposited on the resultant structure (FIG. 5).

Figure 6:
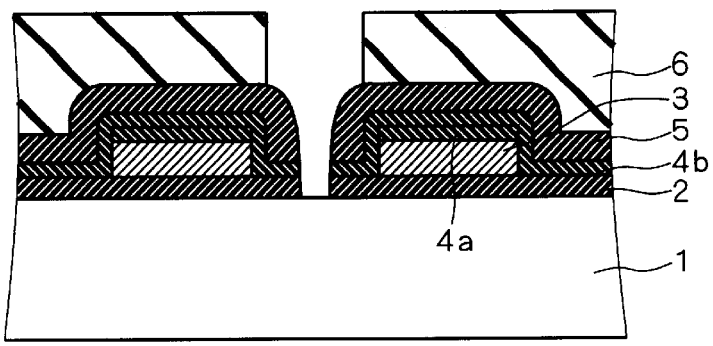

The TEOS oxide film 6 is deposited and flattened by a CMP process. Thereafter, a contact hole is formed by selectively etching the TEOS oxide film 6, the silicon nitride film 5 and the low-k film 4b (FIG. 6). Even if the silicon nitride film 5 and the low-k film 4b which lie on the upper surface of the gate electrode 3 are etched during the formation of the contact hole, the presence of the low-k film 4a prevents the upper surface of the gate electrode 3 from being exposed. Thus, the position of the contact hole is determined in a self-aligned manner.

Figure 7:
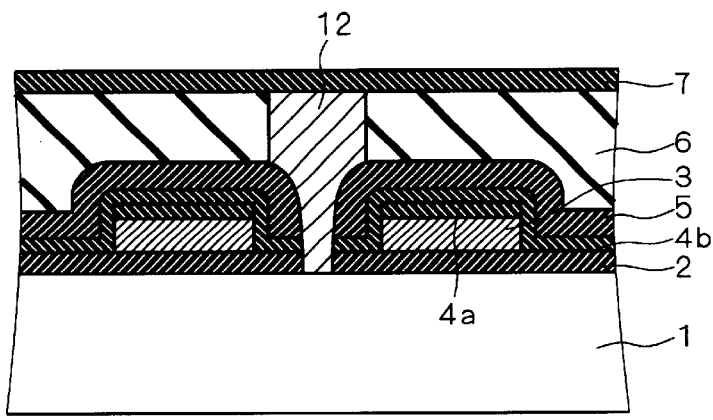

Thereafter, polysilicon is deposited to fill the contact hole, and part of the polysilicon overlying the TEOS oxide film 6 is etched. This forms the contact plug 12 in the contact hole. The low-k film 7 is deposited on the resultant structure (FIG. 7).

Figure 8:
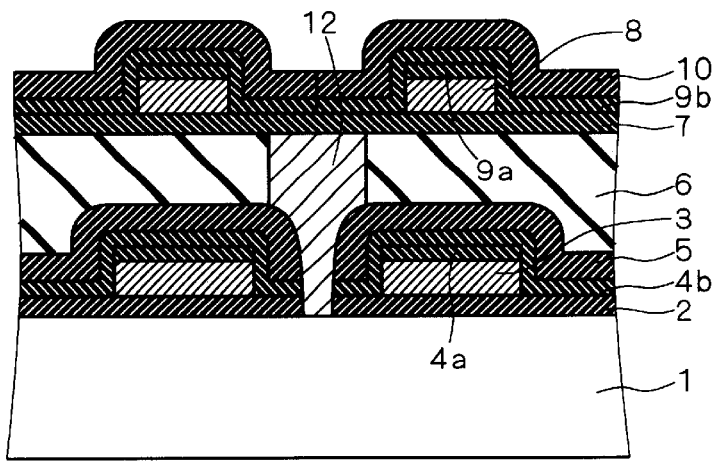

Next, for example, W or polysilicon is deposited on the low-k film 7, and a low-k film is formed on the W or polysilicon. Etching is performed to form the bitline 8 with the low-k film 9a formed on the upper surface thereof. The low-k film 9b and the silicon nitride film 10 are deposited on the resultant structure (FIG. 8).

Figure 9:
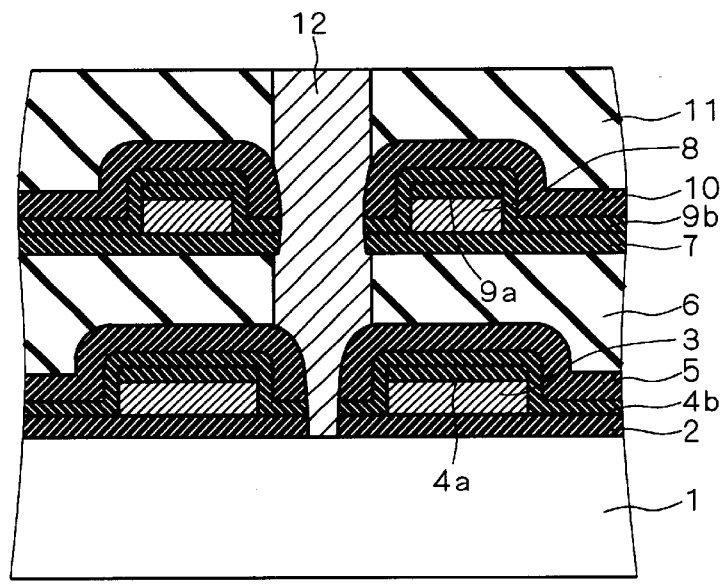
Figure 10:
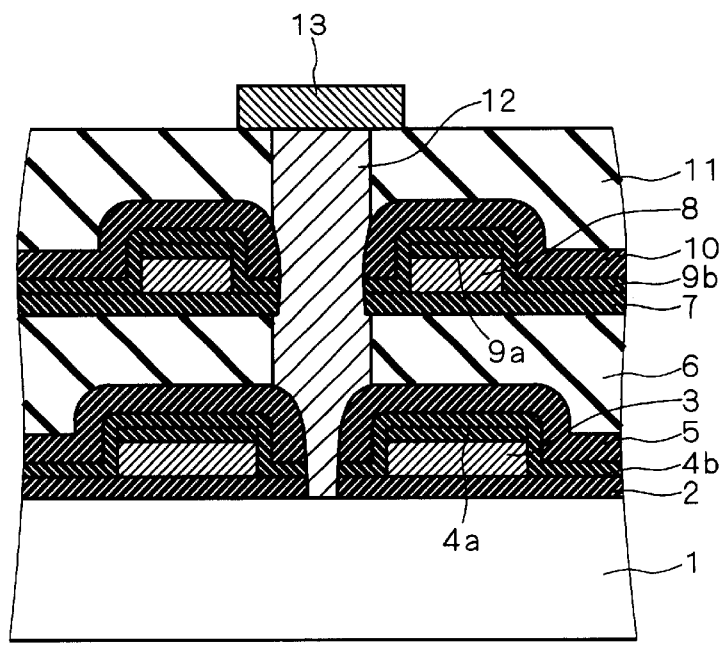

The BPSG film 11 is deposited and flattened. Thereafter, a contact hole is formed by selectively etching the BPSG film 11, the silicon nitride film 10 and the low-k film 9b. Even if the silicon nitride film 10 and the low-k film 9b which lie on the upper surface of the bitline 8 are etched during the formation of the contact hole, the presence of the low-k film 9a prevents the upper surface of the bitline 8 from being exposed. Thus, the position of the contact hole is determined in a self-aligned manner. Thereafter, polysilicon is deposited to fill the contact hole, and part of the polysilicon overlying the BPSG film 11 is etched. This forms the contact plug 12 in the contact hole (FIG. 9). The storage node electrode 13 is formed on the resultant structure (FIG. 10).

As discussed above, even if the silicon nitride films 5 and 10 on the gate electrode 3 and the bitline 8 are exposed in the contact hole in the steps of forming the contact hole shown in FIGS. 6 and 9, this method can prevent a short circuit between the contact plug 12 and the gate electrode 3 and between the contact plug 12 and the bitline 8.

Additionally, although the silicon nitride films 5 and 10 are formed around the gate electrode 3 and the bitline 8, the formation of the low-k films 4a, 4b, 7, 9a, 9b in contact with the gate electrode 3 and the bitline 8 suppresses the increase in parasitic capacitance resulting from the presence of the silicon nitride films.

The semiconductor device according to the preferred embodiment shown in FIG. 1 is formed by the executing the above-mentioned steps.

Figure 11:
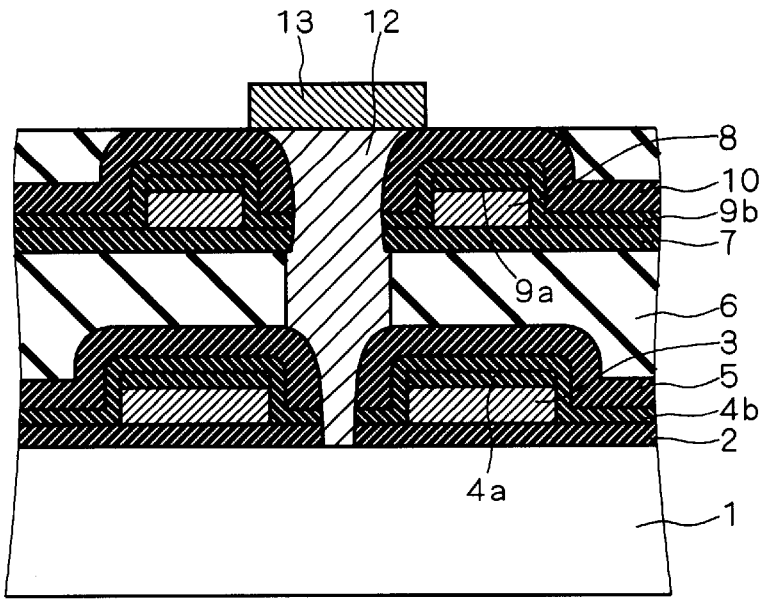
FIG. 11 is a sectional view showing another construction of the semiconductor device according to the preferred embodiment.

After the formation of the low-k film 9b and the silicon nitride film 10 on the bitline 8, the contact hole and the contact plug may be formed without depositing the BPSG film. In this case, the storage node electrode 13 is formed directly on the silicon nitride film 10, as illustrated in FIG. 11.

<Modifications>

The above description has illustrated the construction of the present invention in which the low-k films are formed on the electrode or interconnect line of the semiconductor device having the SAC structure. However, the provision of the low-k film on the electrode or interconnect line is effective to reduce the capacitance of every electrode and interconnect line independently of the structure of the semiconductor device.

FIGS. 12 through 15 show a modification of the present invention in a step-by-step manner when providing the low-k film on a gate electrode of a common MOS transistor, for example.

Figure 12:
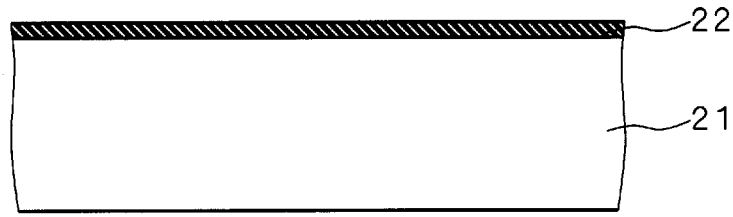
FIGS. 12 through 15 are views showing a modification of the method of manufacturing the semiconductor device in a step-by-step manner according to the preferred embodiment.

First, a gate insulation film 22 made of silicon oxide is formed on a silicon substrate 21 (FIG. 12). Next, for example, WSi or polysilicon is deposited on the gate insulation film 22 and is patterned to form a gate electrode 23.

Figure 13:
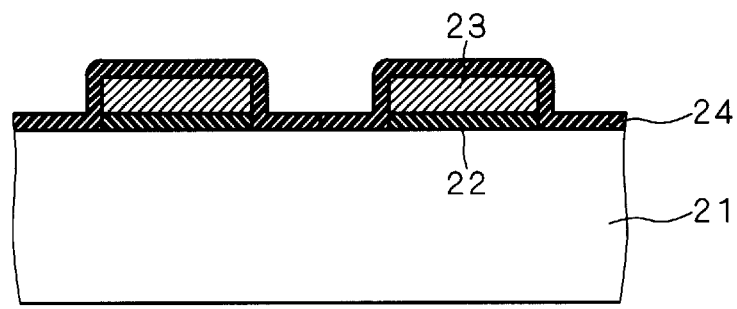
Figure 14:
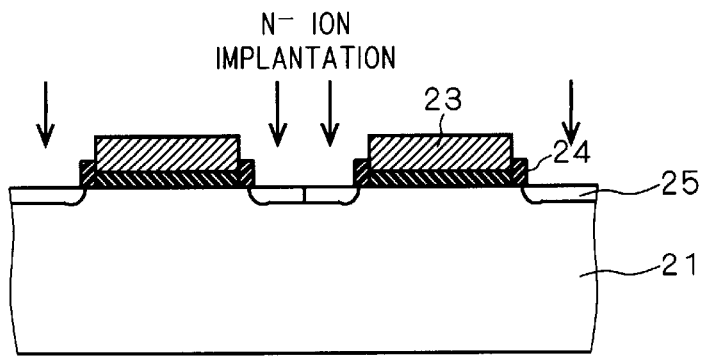

Thereafter, a low-k film 24 is deposited on the resultant structure (FIG. 13). As shown in FIG. 14, etching is performed so that the low-k film 24 remains on a lower portion of the side surface of the gate electrode 23, and ions are implanted using the gate electrode 23 as a mask to form N⁻ source/drain regions 25. A silicon nitride film is deposited and etched back to form sidewalls. Then, ions are implanted again to form N⁺ source/drain regions (FIG. 15).

Figure 15:
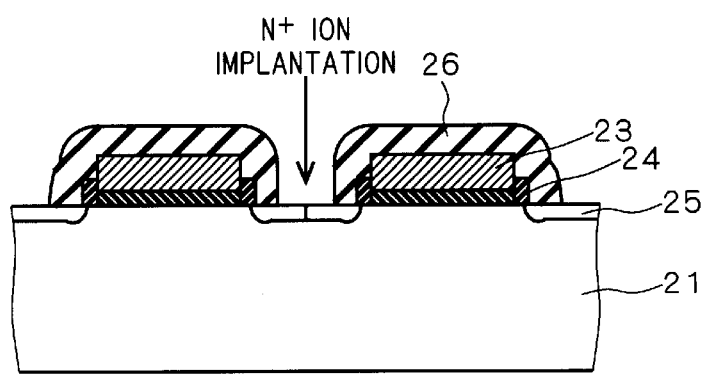

The MOS transistor having the low-k film 24 on the lower portion of the side surface of the gate electrode 23 is formed, as shown in FIG. 15, by executing the above-mentioned steps. It is known that the lower portion of the side surface of the gate electrode 23 has an especially high electric flux density. The formation of the low-k film in such a portion efficiently mitigates the electric flux density to reduce the parasitic capacitance of the gate electrode 23.

Of course, the low-k film 24 may be configured to remain also on the side and upper surfaces of the gate electrode. As illustrated in the above preferred embodiment, the formation of the low-k film in contact with the gate electrode 23 in this modification efficiently produces the effect of reducing the capacitance of the gate electrode 23.

Figure 16:
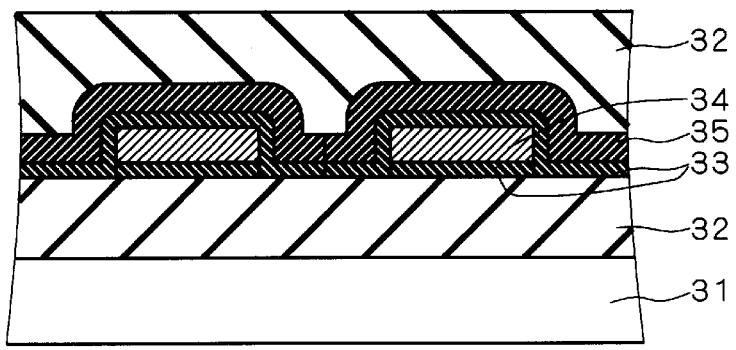
FIG. 16 is a sectional view showing a modification of the semiconductor device according to the preferred embodiment.
Figure 17A:
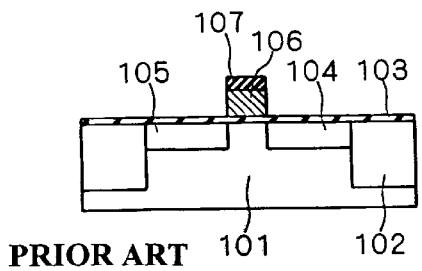
FIGS. 17A through 17H are views showing a method of manufacturing a background art semiconductor device in a step-by-step manner.
Figure 17B:
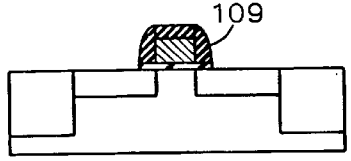
Figure 17C:
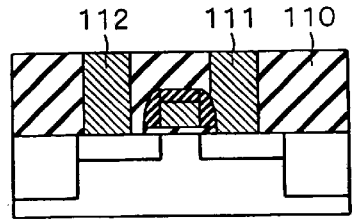
Figure 17D:
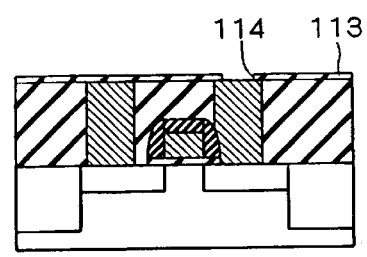
Figure 17E:
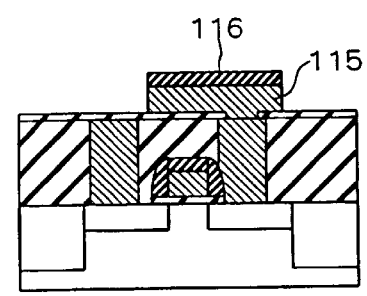
Figure 17F:
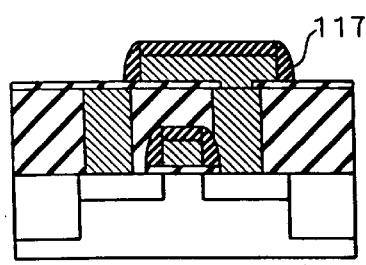
Figure 17G:
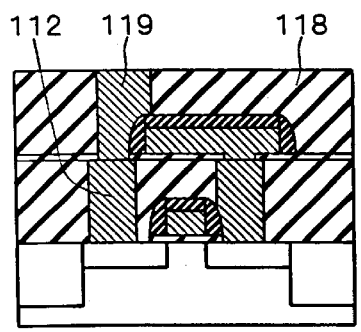
Figure 17H:
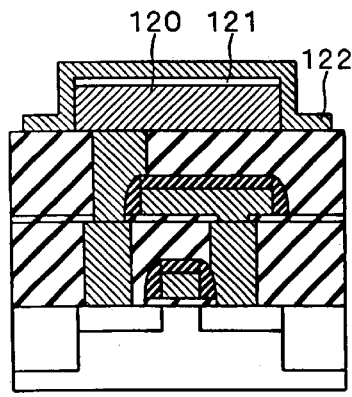

FIG. 16 shows another modification of the present invention, for example, in which a low-k film is provided around a common interconnect line. In FIG. 16, the reference numeral 31 designates a silicon substrate; 32 designates an interlayer insulation film made of polyimide; 33 designates a low-k film; 34 designates an aluminum interconnect line; and 35 designates a silicon nitride film. It is obvious that the provision of the low-k film 33 around such a common interconnect line 34 as shown in FIG. 16 reduces the capacitance of the interconnect line 34. It is needless to say that the formation of the low-k film 33 in contact with the interconnect line 34 in this modification efficiently reduces the capacitance of the interconnect line 34.

While the invention has been described in detail, the foregoing description is in all aspects illustrative and not restrictive. It is understood that numerous other modifications and variations can be devised without departing from the scope of the invention.

What is claimed is:

1. A semiconductor device having a self-aligned contact structure, comprising:
    a conductor including an electrode and an interconnect line;
    a contact plug;
    a silicon nitride film serving as an insulation film between said conductor and said contact plug; and
    a low dielectric constant insulation film having a dielectric constant lower than that of said silicon nitride film and formed at least between said conductor and said silicon nitride film, said low dielectric constant insulation film being provided in contact with said conductor, wherein
    said conductor is a gate electrode formed on a gate insulation film, and
    said low dielectric constant insulation film and said silicon nitride film are formed on upper and side surfaces of said gate electrode.

2. The semiconductor device according to claim 1, wherein
    said low dielectric constant insulation film is made of a material selected from the group consisting of SiOF, SiOC, organic SOG (Spin On Glass), HSQ (hydrogen silsesquioxane), CVD organic silicon oxide, porous silica, organic polymers, polyimides, aromatic ethers, aromatic hydrocarbons, cyclobutane derivatives, fluoropolymers, and amorphous fluorocarbons.

* * * * *